(12) United States Patent
Zhou et al.

(10) Patent No.: US 10,295,855 B2
(45) Date of Patent: May 21, 2019

(54) TOUCH SUBSTRATE AND TOUCH LIQUID CRYSTAL DISPLAY PANEL

(71) Applicants: BOE TECHNOLOGY GROUP CO., LTD., Beijing (CN); CHENGDU BOE OPTOELECTRONICS TECHNOLOGY CO., LTD., Chengdu, Sichuan (CN)

(72) Inventors: Gang Zhou, Beijing (CN); Zhengdong Zhang, Beijing (CN); Hua Tian, Beijing (CN); Xiaofei Yang, Beijing (CN); Zailong Mo, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan (CN)

( * ) Notice: Subject to any disclaimer, the term of this patent is extended or adjusted under 35 U.S.C. 154(b) by 0 days.

(21) Appl. No.: 15/541,598

(22) PCT Filed: Jan. 13, 2017

(86) PCT No.: PCT/CN2017/071127
§ 371 (c)(1),
(2) Date: Jul. 5, 2017

(87) PCT Pub. No.: WO2017/185833
PCT Pub. Date: Nov. 2, 2017

(65) Prior Publication Data
US 2018/0203279 A1 Jul. 19, 2018

(30) Foreign Application Priority Data

Apr. 29, 2016 (CN) .......................... 2016 1 0282657

(51) Int. Cl.
*G06F 3/041* (2006.01)
*H01L 27/12* (2006.01)
(Continued)

(52) U.S. Cl.
CPC .... *G02F 1/13338* (2013.01); *G02F 1/133382* (2013.01); *G02F 1/133512* (2013.01);
(Continued)

(58) Field of Classification Search
None
See application file for complete search history.

(56) References Cited

U.S. PATENT DOCUMENTS 9,836,165 B2 * 12/2017 Nho ................ G06F 3/0421
2014/0078408 A1 * 3/2014 Shim ................ G02F 1/1313
349/2

(Continued)

FOREIGN PATENT DOCUMENTS

| CN | 101398551 A | 4/2009 |
| CN | 103018942 A | 4/2013 |

(Continued)

OTHER PUBLICATIONS

International Search Report and Written Opinion dated Mar. 31, 2017: PCT/CN2017/071127.
(Continued)

*Primary Examiner* — Ryan Crockett
(74) *Attorney, Agent, or Firm* — Ladas & Parry LLP; Loren K. Thompson (57) ABSTRACT

The present disclosure provides a touch substrate and a touch liquid crystal display panel. The touch substrate has an active display region. The touch substrate includes: a base substrate; a plurality of touch electrodes formed on the base substrate and positioned in the active display region; and a conductive layer formed on the base substrate and posi-
(Continued)

tioned in the active display region, wherein the conductive layer is configured to generate heat in a state of being applied with a voltage, wherein the conductive layer is electrically insulated from any of the touch electrodes, and in a direction perpendicular to the base substrate, the conductive layer is not overlapped with any of the touch electrodes.

16 Claims, 4 Drawing Sheets

(51) Int. Cl.
    *G02F 1/1333* (2006.01)
    *G02F 1/1335* (2006.01)
    *G02F 1/1362* (2006.01)

(52) U.S. Cl.
    CPC .. *G02F 1/133514* (2013.01); *G02F 1/136286* (2013.01); *G06F 3/041* (2013.01); *G06F 3/0412* (2013.01); *H01L 27/124* (2013.01); *G02F 2201/121* (2013.01); *G02F 2201/123* (2013.01)

(56) References Cited

U.S. PATENT DOCUMENTS

| | | | |
|---|---|---|---|
| 2014/0118642 A1* | 5/2014 | Wang | G02F 1/13338 349/12 |
| 2015/0062453 A1* | 3/2015 | Kim | G02F 1/136286 349/12 |
| 2015/0123917 A1 | 5/2015 | Chen et al. | |
| 2016/0103358 A1* | 4/2016 | Tanaka | G06F 3/0412 349/12 |
| 2016/0178949 A1* | 6/2016 | Wang | G02F 1/13338 349/12 |
| 2016/0187695 A1* | 6/2016 | Cho | G02F 1/13338 349/12 |
| 2016/0291767 A1 | 10/2016 | Ding et al. | |
| 2017/0090240 A1* | 3/2017 | Liu | G02F 1/13338 |
| 2017/0177129 A1 | 6/2017 | Li et al. | |
| 2017/0205910 A1 | 7/2017 | Liu et al. | |
| 2018/0039129 A1* | 2/2018 | Liao | G02F 1/133382 |

FOREIGN PATENT DOCUMENTS

| | | |
|---|---|---|
| CN | 104464898 A | 3/2015 |
| CN | 204302619 U | 4/2015 |
| CN | 104699311 A | 6/2015 |
| CN | 104765181 A | 7/2015 |
| CN | 105068295 A | 11/2015 |
| CN | 105223722 A | 1/2016 |
| CN | 105739155 A | 7/2016 |
| JP | 2010-281961 A | 12/2010 |
| KR | 1020120055367 A | 5/2012 |

OTHER PUBLICATIONS

The First Chinese Office Action dated Jun. 26, 2018; Appln. No. 201610282657.0.

* cited by examiner

TOUCH SUBSTRATE AND TOUCH LIQUID CRYSTAL DISPLAY PANEL

TECHNICAL FIELD

Embodiments of the present disclosure relate to a touch substrate and a touch liquid crystal display panel.

BACKGROUND

In a related art, for a touch display panel, such as an on cell touch panel or a One Glass Solution (OGS) touch panel and the like, a transparent conductive film (which is generally formed by Indium Tin Oxide (ITO)) with a certain touch structure is arranged on a surface of a glass substrate so as to achieve a touch function. A refractive index of a transparent conductive film material (ITO) is generally greater than that of glass, which can cause a case that transmittance of a portion on a display screen, which is covered with the transparent conductive film material, is smaller than that of a hollow portion uncovered with the transparent conductive film material, thus resulting alternately dark and bright touch strips on the display screen.

A conventional liquid crystal display module with a heating function generally is formed by three components: a backlight plate, a heating plate and a liquid crystal display panel. The heating plate is generally placed between the liquid crystal display panel and the backlight board, or is placed on a surface of the liquid crystal display module. The liquid crystal panel is heated by the heating plate. This structure not only increase a thickness and a weight of the liquid crystal display module, but also is poor in heating effect due to a case that the heating plate is far away from liquid crystals.

SUMMARY

An embodiment of the present disclosure provides a touch substrate, with an active display region, the touch substrate comprising: a base substrate; a plurality of touch electrodes formed on the base substrate and positioned in the active display region; and a conductive layer formed on the base substrate and positioned in the active display region, wherein the conductive layer is configured to generate heat in a state of being applied with a voltage, wherein the conductive layer is electrically insulated from any of the touch electrodes, and in a direction perpendicular to the base substrate, the conductive layer is not overlapped with any of the touch electrodes.

Another embodiment of the present disclosure provides a touch liquid crystal display panel, comprising: an array substrate, a counter substrate, and a liquid crystal layer arranged between the array substrate and the counter substrate, wherein the array substrate includes a first base substrate and a plurality of pixel units formed on the first base substrate, and the counter substrate includes a second base substrate; and the touch liquid crystal display panel further comprising: a plurality of touch electrodes formed on at least one of the first base substrate and the second base substrate, and a conductive layer formed on at least one of the first base substrate and the second base substrate, wherein the conductive layer is configured to generate heat in a state of being applied with a voltage, the touch liquid crystal display panel has an active display region, the plurality of touch electrodes and the conductive layer are positioned in the active display region, the conductive layer is electrically insulated from any of the touch electrodes, and in a direction perpendicular to the second base substrate, the conductive layer is not overlapped with any of the touch electrodes.

BRIEF DESCRIPTION OF THE DRAWINGS

In order to clearly illustrate the technical solution of the embodiments of the disclosure, the drawings of the embodiments or description in the prior art will be briefly described in the following. It is obvious that the described drawings are only related to some embodiments of the disclosure and thus are not limitative of the disclosure.

DETAILED DESCRIPTION

The technical solution of the embodiments of the present disclosure will be described in a clearly and fully understandable way in connection with the drawings. With reference to non-restrictive exemplary embodiments shown in the drawings and described in details below, exemplary embodiments of the present disclosure and various characteristics and advantageous details thereof will be more comprehensively illustrated. It should be noted that characteristics shown in the drawings do not need to be drawn proportionally. Description on known materials, components and process technologies is omitted, so that the exemplary embodiments of the present disclosure are not fuzzy. The examples only aim to benefit for understanding implementation of the exemplary embodiments of the present disclosure and further enabling those skilled in the art to implement the exemplary embodiments. Therefore, those examples should not be understood as limitation to the scope of the embodiments of the present disclosure.

Unless otherwise defined, the technical terms or scientific terms here should be of general meaning as understood by those ordinarily skilled in the art. In the present disclosure, words such as "first", "second" and the like do not denote any order, quantity, or importance, but rather are used for distinguishing different components. Words such as "include" or "comprise" and the like denote that elements or objects appearing before the words of "include" or "comprise" cover the elements or the objects enumerated after the words of "include" or "comprise" or equivalents thereof, not exclusive of other elements or objects. Words such as "connected" or "connecting" and the like are not limited to physical or mechanical connections, but may include electrical connection, either direct or indirect. Words such as "up", "down", "left", "right", "horizontal", "longitudinal" and the like are only used for expressing a relative positional relationship, when the absolute position of a described object is changed, the relative positional relationship may also be correspondingly changed.

Figure 1:
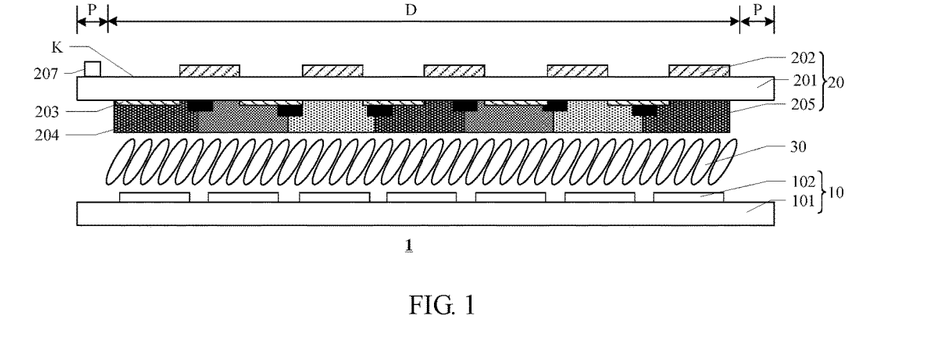
FIG. 1 is a schematic diagram showing a partial sectional structure of a touch liquid crystal display panel provided by an embodiment of the present disclosure.

One embodiment of the present disclosure provides a touch liquid crystal display panel 1, with reference to FIG. 1, including an array substrate 10, a counter substrate 20, and a liquid crystal layer 30 arranged between the array substrate 10 and the counter substrate 20.

The array substrate 10 includes a first base substrate 101 and a plurality of pixel units 102 formed on the first base substrate 101. Although not shown in FIG. 1, the array substrate further includes a plurality of gate lines and a plurality of data lines. These gate lines and data lines intersect with each other so as to define the pixel units 102 arranged in a matrix; each pixel unit 102 includes a thin film transistor (not shown) serving as a switching element and a pixel electrode for controlling arrangement of liquid crystals. The pixel electrode is configured for applying an electric field to control a rotation degree of liquid crystal molecules so as to carry out a display operation. For example, a gate electrode of the thin film transistor of each pixel unit and the corresponding gate line are electrically connected or integrally formed, a source electrode and the corresponding data line are electrically connected or integrally formed, and a drain electrode and the corresponding pixel electrode are electrically connected or integrally formed. In FIG. 1, exemplarily, the plurality of pixel electrodes 102 represents a plurality of pixel units 102.

The counter substrate 20 includes a second base substrate 201 and a plurality of touch electrodes 202 formed on an upper surface of the second base substrate and arranged periodically. As shown in FIG. 1, the counter substrate 20 further includes a black matrix 204 and a color filter layer 205 which are formed on the second base substrate 201. In another embodiment, the black matrix 204 and the color filter layer 205, for example, may be formed in the array substrate 10. Although not shown in FIG. 1, the counter substrate 20, for example, may further include a common electrode layer for controlling rotation of the liquid crystal molecules together with the plurality of pixel electrodes 102 on the array substrate 10.

The touch liquid crystal display panel 1 further includes: a conductive layer 203 formed on a lower surface of the second base substrate 201. The conductive layer 203 is configured to generate heat in a state of being applied with a voltage. The conductive layer 203 is electrically insulated from any of the touch electrodes 202.

The touch liquid crystal display panel 1 has one active display region D and a peripheral region P surrounding the active display region D. The plurality of touch electrodes 202 and the conductive layer 203 are all positioned in the active display region D.

In the embodiment of the present disclosure, the conductive layer 203 used as a heating layer is embedded into a structure of the touch liquid crystal display panel 1, so that on one hand, a display effect and a touch effect of the touch liquid crystal display panel 1 at a low temperature are improved, and on the other hand, a weight and a thickness of the touch liquid crystal display panel 1 are not increased and lighting and thinning of the touch liquid crystal display panel are implemented.

Figure 2:
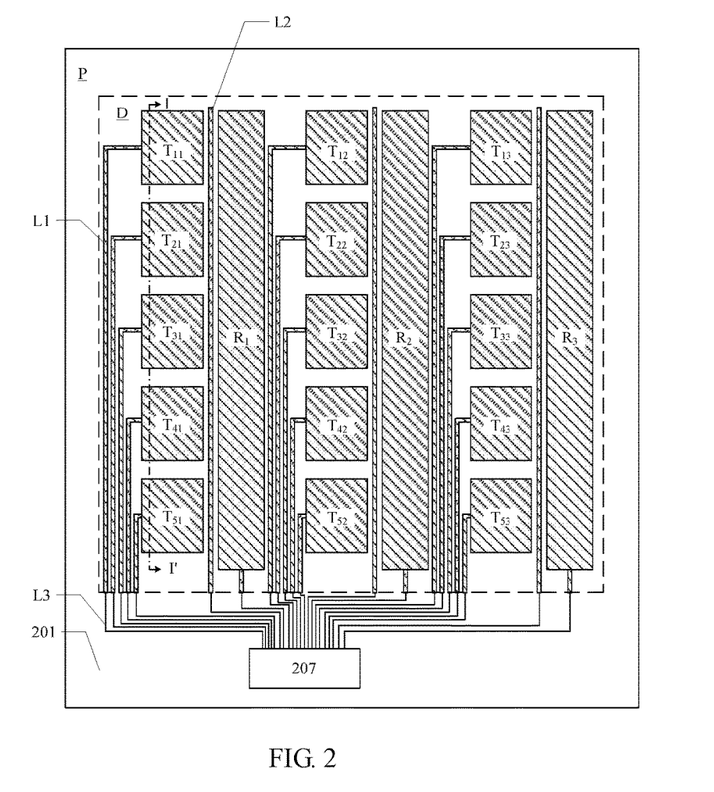
FIG. 2 is a top-view structural schematic diagram showing the touch liquid crystal display panel provided by the embodiment of the present disclosure.

FIG. 2 shows a top-view structural schematic diagram of the touch liquid crystal display panel provided by the embodiment of the present disclosure.

With reference to FIG. 1 and FIG. 2, the plurality of touch electrodes 202 formed on the upper surface of the second base substrate 201 of the counter substrate 20, for example, includes a plurality of rectangular touch driving electrodes $T_{11}$ to $T_{53}$ and a plurality of strip touch sensing electrodes $R_1$ to $R_3$. The touch driving electrodes $T_{11}$ to $T_{53}$ are arranged in a matrix of 5 rows and 3 columns, and three touch sensing electrodes $R_1$ to $R_3$ are respectively arranged on a right side of each column of touch driving electrodes. It is understood that both the numbers and the shapes of the touch driving electrodes and the touch sensing electrodes herein are exemplary. The touch driving electrodes $T_{11}$ to $T_{53}$ and the touch sensing electrodes $R_1$ to $R_3$ are periodically arranged on the second base substrate 201. In the embodiment, the touch driving electrodes $T_{11}$ to $T_{53}$ and the touch sensing electrodes $R_1$ to $R_3$ are arranged in a same layer level and are formed by a same transparent conductive material (e.g., indium tin oxide). In another embodiment, the touch driving electrodes $T_{11}$ to $T_{53}$ and the touch sensing electrodes $R_1$ to $R_3$ may be positioned in different layer levels in the touch liquid crystal display panel 1. Moreover, a forming material of the touch driving electrodes $T_{11}$ to $T_{53}$ may be different from that of the touch sensing electrodes $R_1$ to $R_3$.

In the embodiment of the present disclosure, in a direction perpendicular to the touch liquid crystal display panel 1, i.e., in a direction perpendicular to the second base substrate 201, the conductive 203 is not overlapped with each touch electrode 202. Namely, an orthogonal projection of the conductive layer 203 on the upper surface K of the second base substrate 201 is not overlapped with an orthogonal projection of each touch electrode 202 on the upper surface K of the second base substrate 201. Herein, a case that two orthogonal projections are not overlapped includes a case that edges of the two projections are partially overlapped.

Figure 3:
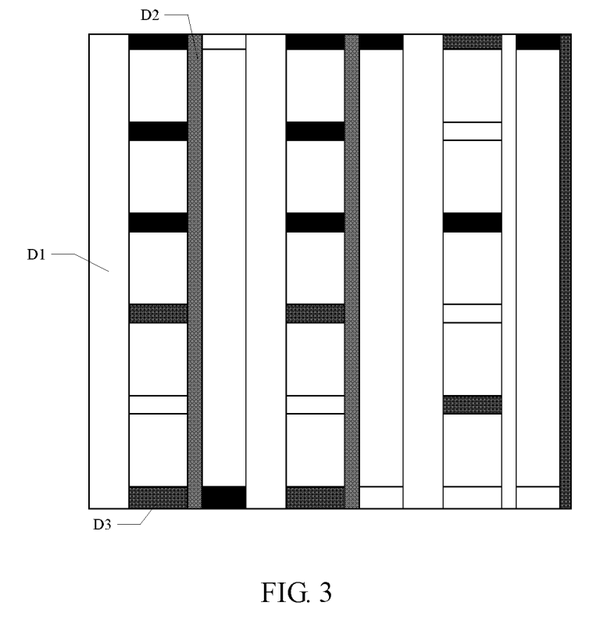
FIG. 3 is a schematic diagram showing distribution of a plurality of gap regions in an active display region of the touch liquid crystal display panel provided by the embodiment of the present disclosure.

FIG. 3 is a schematic diagram showing distribution of the plurality of gap regions according to the embodiment of the present disclosure.

With reference to FIG. 1 to FIG. 3, the active display region D of the touch liquid crystal display panel 1 includes a plurality of first gap regions D1, a plurality of second gap regions D2 and a plurality of third gap regions D3, which are not occupied by the plurality of touch electrodes 203. Herein, it should be noted that in the embodiment of the present disclosure, the active display region D, the peripheral region P and the first to third gap regions D1-D3 all refer to regions running through an entire thickness range of the touch liquid crystal display panel 1. For example, with reference to FIG. 2 and FIG. 3, in the direction perpendicular to the touch liquid crystal display panel 1, the active display region D is not overlapped with the peripheral region P; and the first to third gap regions D1-D3 are not overlapped with each other. For example, with reference to FIG. 3, a combination (i.e., a combination of gray regions with different gray scales) of all the first to third gap regions D1-D3 is complementary to a combination (a white region) of regions occupied by the plurality of touch electrodes 203. That is, all the first to third gap regions D1-D3 and the regions occupied by the plurality of touch electrodes 203, for example, together constitute the active display region D. Herein, the active display region D, the peripheral region P and the first to third gap regions D1-D3 are also correspondingly applicable to regional division of the array substrate 10 and the counter substrate 20 of the touch liquid crystal display panel 1. Namely, the array substrate 10 and the counter substrate 20 can also be correspondingly divided into an active display region D and a peripheral region P, wherein the active display region D includes a plurality of non-overlapped first to third gap regions D1-D3 which are not occupied by the plurality of touch electrodes 203. Herein, the active display regions D, the peripheral regions P and the first to third gap regions D1-D3 of the array substrate 10 and the counter substrate 20 also means regions respectively running through entire thickness ranges of the array substrate 10 and the counter substrate 20.

In FIG. 3, the first to third gap regions D1-D3 are respectively shown by a small gray scale region, an intermediate gray scale region and a large gray scale region.

For example, the first gap region D1 is a longitudinal strip gap region shown by a small gray scale in FIG. 3. An orthogonal projection of the first gap region D1 on the upper surface K of the second base substrate 201 is abutted with left edges of orthogonal projections of one column of touch driving electrodes on the upper surface K of the second base substrate 201, and for example, a right edge of the orthogonal projection of the left first gap region D1 on the upper surface K of the second base substrate 201 is overlapped with the left edge of the orthogonal projections of the respective touch driving electrodes T11-T51 in the left column on the upper surface K of the second base substrate 201, and an upper edge, a lower edge and a left edge of the left first gap region D1 are overlapped with corresponding edges of the active display region D. A right edge of an orthogonal projection of the middle first gap region D1 on the upper surface K of the second base substrate 201 is overlapped with the left edges of the orthogonal projection of the respective touch driving electrodes T12-T52 in the middle column on the upper surface K of the second base substrate 201, a left edge of the orthogonal projection of the middle first gap region D1 on the upper surface K of the second base substrate 201 is overlapped with a right edge of an orthogonal projection of the left touch sensing electrode R1 on the upper surface K of the second base substrate 201, and an upper edge and a lower edge of the middle first gap region D1 are overlapped with the corresponding edges of the active display region D. A right edge of an orthogonal projection of the right first gap region D1 on the upper surface K of the second base substrate 201 is overlapped with the left edge of the orthogonal projection of the respective touch driving electrodes T13-T53 in the right column on the upper surface K of the second base substrate 201, a left edge of the orthogonal projection of the right first gap region D1 on the upper surface K of the second base substrate 201 is overlapped with a right edge of an orthogonal projection of the middle touch sensing electrode $R_2$ on the upper surface K of the second base substrate 201, and an upper edge and a lower edge of the right first gap region D1 are overlapped with the corresponding edges of the active display region D.

For example, the second gap region D2 is a longitudinal strip gap region shown by an intermediate gray scale in FIG. 3. An orthogonal projection of the second gap region D2 on the upper surface K of the second base substrate 201 is abutted with right edges of orthogonal projections of the respective columns of the touch driving electrodes on the upper surface K of the second base substrate 201 and left edges of orthogonal projections of the respective strip touch sensing electrodes on the upper surface K of the second base substrate 201. For example, a left edge of the orthogonal projection of each second gap region D2 on the upper surface K of the second base substrate 201 is overlapped with the right edge of the orthogonal projection of each of the touch driving electrodes in the adjacent column on the upper surface K of the second base substrate 201; a right edge of the orthogonal projection of each second gap region D2 on the upper surface K of the second base substrate 201 is overlapped with a left edge of an orthogonal projection of the adjacent touch sensing electrode on the upper surface K of the second base substrate 201, and an upper edge and a lower edge of each second gap region D2 are correspondingly overlapped with an upper edge and a lower edge of the active display region D.

For example, the third gap region D3 is a gap region in the active display region D except for the first gap region D1 and the second gap region D2, and is shown by a large gray scale in FIG. 3. With reference to FIG. 3, an orthogonal projection of the third gap region D3 on the upper surface K of the second base substrate 201, for example, is overlapped with an upper edge, a lower edge or a side edge of an orthogonal projection of the touch electrode 202 on the upper surface K of the second base substrate 201.

That is, the edge of the orthogonal projection of each of the gap regions D1 to D3 on the upper surface K of the second base substrate 201 is at least partially overlapped with the edge of the orthogonal projection of at least one of the plurality of touch electrodes 202 on the upper surface K of the second base substrate 201.

It is understood that division of the first to third gap regions D1 to D3 is exemplary. In embodiments of the present disclosure, division of the gap regions is not limited thereto.

In the direction perpendicular to the second base substrate, the plurality of touch electrodes 202 are not overlapped with any of the gap regions.

In the embodiment of the present disclosure, the conductive layer 203, for example, is positioned in at least one of the gap regions.

A sectional structure of the touch liquid crystal display panel 1 shown in FIG. 1, for example, is a sectional structure cut out along an I-I' line shown in FIG. 2. It should be noted that in order to clearly illustrate, dimension scales of corresponding structures in FIG. 1 and FIG. 2 does not match. With reference to FIG. 1 to FIG. 3, in the embodiment, the conductive layer 203, for example, is at least formed in the third gap region D3. The conductive layer 203, for example, is formed by the transparent conductive material. For example, the forming material of the conductive layer 203 is the same with a forming material of the touch electrode 202. In the embodiment shown in FIG. 1, the conductive layer 203, for example, fills in the third gap region D3 between two adjacent touch driving electrodes in each column of touch driving electrodes.

Figure 4:
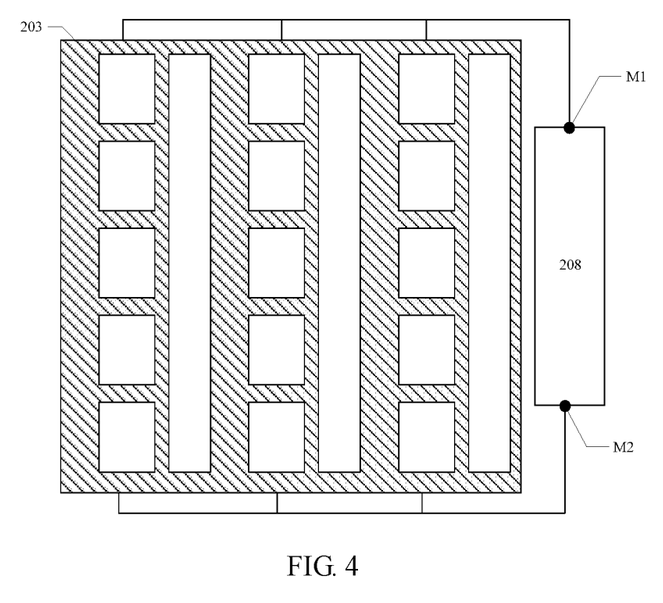
FIG. 4 shows a pattern of a conductive layer in a touch liquid crystal display panel provided by an embodiment of the present disclosure.

In another embodiment, the conductive layer 203, for example, fills in all of the first to third gap regions D1-D3 in the active display region D of the touch liquid crystal display panel 1, with reference to FIG. 4. That is, the orthogonal projection of the conductive layer 203 on the upper surface K of the second base substrate 201 and the orthogonal projections of the plurality of touch electrodes 202 on the upper surface K of the second base substrate 201 cover all the upper surface K of the second base substrate 201 in the active display region D. Further with reference to FIG.

4, the conductive layer 203 is electrically connected to a voltage supply unit 208. For example, an upper end of the conductive layer 203 is connected to a first terminal M1 of the voltage supply unit 208; and lower ends of conductive strips S1 to S3 are connected to a second terminal M2 of the voltage supply unit 208. For example, in a working state, a potential of the first terminal M1 of the voltage supply unit 208 is different from that of the second terminal M2 of the voltage supply unit 208. Therefore, the conductive layer 203 is applied with the voltage so as to generate heat for heating the touch liquid crystal display panel 1.

Therefore, in the touch liquid crystal display panel 1 provided by the embodiment of the present disclosure, in the direction perpendicular to the touch liquid crystal display panel 1, the conductive layer 203 is not overlapped with any of the touch electrodes 202. Therefore, a phenomenon of dark and bright strips of the touch liquid crystal display panel, which are caused by patterns of the touch electrodes, can be reduced or eliminated, so that when the low-temperature display effect and touch effect of the touch liquid crystal display panel are improved, display quality can be improved.

With further reference to FIG. 2, the touch liquid crystal display panel 1 further includes at least one wiring formed on the second base substrate 201 and positioned in at least one of the first to third gap regions D1 to D3. In the embodiment, for example, the at least one wiring includes a driving signal line L1 formed in the first gap region D1 and a common electrode line L2 formed in the second gap region D2. The at least one wiring and the plurality of touch electrodes are positioned on a same layer level and formed by a same material. For example, the driving signal line L1 and the common electrode line L2 and the plurality of touch electrodes 202 are arranged on the same layer and formed by the same transparent conductive material. The driving signal line L1 and the common electrode line L2, for example, are connected to a control unit 207 respectively via a plurality of metal traces L3 positioned in the peripheral region. A plurality of driving signal lines L1 positioned in the first gap region D1 are respectively connected with the corresponding touch driving electrodes $T_{11}$ to $T_{53}$, and are used for transmitting driving signals from the control unit 207. The common electrode line L2, for example, receives a common signal from the control unit 207. For example, all the common electrode lines L2 are grounded.

With reference to FIG. 2 and FIG. 3, five driving signal lines L1 are formed in each first gap region D1, one common electrode line L2 is formed in each second gap region D2, and no wiring is formed in the third gap region D3. For example, in a transverse direction, a width of each of the lines is 4 to 15 micrometers, and a width of each touch electrode is 1 to 2 millimeters. Therefore, a minimum width (e.g., a transverse width of the first gap region D1 in FIG. 3) of the first gap region D1 is formed to be greater than a minimum width (e.g., a transverse width of the second gap region D2 in FIG. 3) of the second gap region D2, and the minimum width of the second gap region D2 is formed to be greater than a minimum width (e.g., a longitudinal width of the third gap region D3 positioned between two adjacent touch driving electrodes of the same column of touch driving electrodes in FIG. 3) of the third gap region D3. It should be noted that FIG. 3 only exemplarily shows distribution of the gap regions, but the shown size and scale of each gap region will not necessarily reflect the actual situation.

Figure 5:
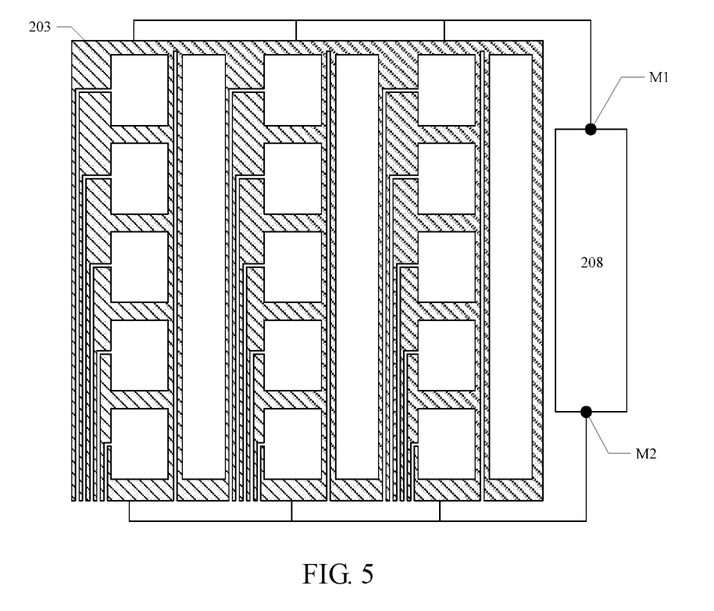
FIG. 5 shows a pattern of another conductive layer in a touch liquid crystal display panel provided by an embodiment of the present disclosure.
Figure 6:
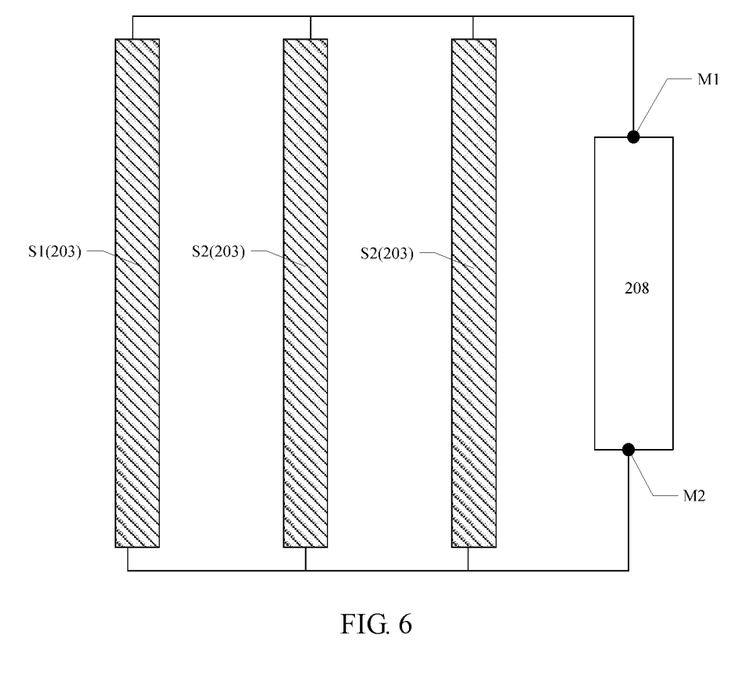
FIG. 6 shows a pattern of yet another conductive layer in a touch liquid crystal display panel provided by an embodiment of the present disclosure.

Corresponding to patterns of a common electrode 202 and a plurality of wirings L1 and L2 shown in FIG. 2, the conductive layer 203, for example, may have two patterns as shown in FIG. 5 to FIG. 6.

In an example shown in FIG. 5, the orthogonal projection of the conductive layer 203 on the upper surface K of the second base substrate 201 is not overlapped with an orthogonal projection of any one of the plurality of wirings L1 to L2 on the upper surface K of the second base substrate 201, and the orthogonal projection of the conductive layer 203 on the upper surface K of the second base substrate 201 and the orthogonal projections of the plurality of touch electrodes $T_{11}$ to $T_{53}$ and the plurality of wirings L1 and L2 on the upper surface K of the second base substrate 201 cover all the upper surface of the second base substrate 201 in the active display region D. With further reference to FIG. 5, the conductive layer 203 is electrically connected to the voltage supply unit 208. For example, the upper end of the conductive layer 203 is connected to the first terminal M1 of the voltage supply unit 208; and the lower ends of conductive strips S1 to S3 are connected to the second terminal M2 of the voltage supply unit 208. For example, in the working state, the potential of the first terminal M1 of the voltage supply unit 208 is different from that of the second terminal M2 of the voltage supply unit 208. Therefore, the conductive layer 203 is applied with the voltage so as to generate heat for heating the touch liquid crystal display panel 1. In this example, the conductive layer 203 sufficiently fills in regions of the touch liquid crystal display panel 1, in which the plurality of transparent touch electrodes 202 and the plurality of wirings L1 and L2 are not arranged, so that the dark and bright strips of the touch liquid crystal display panel 1 can be sufficiently avoided.

In the first gap region D1, a ratio of portions which are not occupied by the driving signal line L1 is relatively high, and thus, the first gap region D1 also becomes a main distribution region of the bright strips of the touch liquid crystal display panel 1. In an example shown in FIG. 6, the conductive layer 203 only fills in three first gap regions D1 separated from each other, so that the conductive layer 203 is formed to only include three conductive strips S1 to S3 separated from each other. Therefore, in the direction perpendicular to the second base substrate, each driving signal line L1 is overlapped with the corresponding conductive strip. The conductive strips S1 to S3 are all electrically connected to the voltage supply unit 208. For example, upper ends of the conductive strips S1 to S3 are connected to the first terminal M1 of the voltage supply unit 208; and lower ends of the conductive strips S1 to S3 are connected to the second terminal M2 of the voltage supply unit 208. For example, in the working state, the potential of the first terminal M1 of the voltage supply unit 208 is different from that of the second terminal M2 of the voltage supply unit 208. Therefore, the conductive layer 203 is applied with the voltage so as to generate heat for heating a liquid crystal layer 30 of the touch liquid crystal display panel 1. In this example, the conductive layer 203 is only formed in the first gap region D1 with a relatively large minimum width, so that on one hand, a process difficulty and an alignment accuracy requirement of the conductive layer 203 are reduced, and on the other hand, generation of the dark and bright strips of the touch liquid crystal display panel 1 can also be effectively avoided.

The voltage supply unit 208, for example, is a flexible printed circuit board.

In another example which is not shown, the conductive layer 203 only fills in three first gap regions D1 separated from each other and three second gap regions D3 separated from each other.

In the above embodiments of the present disclosure, the plurality of touch driving electrodes $T_{11}$ to $T_{53}$ and the plurality of touch sensing electrodes $R_1$ to $R_3$ are formed at the same layer level, but embodiments of the present disclosure are not limited thereto. In another embodiment, the plurality of touch driving electrodes $T_{11}$ to $T_{53}$ may be formed in a different layer level from the plurality of touch sensing electrodes $R_1$ to $R_3$, in the touch liquid crystal display panel 1.

Moreover, in the embodiments above of the present disclosure, the plurality of touch electrodes 202 and the conductive layer 203 are all formed on the second base substrate 201, but embodiments of the present disclosure are not limited thereto. In another embodiment, the plurality of touch electrodes 202 are formed on the second base substrate 201, but the conductive layer 203 is formed on the first base substrate 101.

Moreover, in the embodiments above of the present disclosure, the conductive layer 203 is formed at one layer level, but embodiments of the present disclosure are not limited thereof. In another embodiment, a portion of the conductive layer 203 may be formed on the first base substrate 101, and the another portion of the conductive layer 203 may be formed on the second base substrate 201.

Moreover, the touch liquid crystal display panel 1, for example, further includes a temperature sensor 206 arranged on the counter substrate 20 and configured for detecting a temperature of the touch liquid crystal display panel 1. For example, the temperature sensor 206 can carry out real-time detection on the temperature of the touch liquid crystal display panel 1. The temperature sensor 206, for example, is arranged in the peripheral region P.

For example, the touch liquid crystal display panel 1 provided by the embodiments of the present disclosure, for example, is formed via a method below: firstly, forming the conductive layer 203 on a lower surface of the second base substrate 201 (e.g., a glass substrate); then sequentially forming the black matrix 204, the color filter layer (e.g., a R/G/B resin layer) and post spacers (not shown) on the conductive layer 203; and next, after carrying out cell assembling of the second base substrate 201 on which the structures are formed and the array substrate 10, forming the plurality of touch electrodes 202 on an outer surface of the second base substrate 201.

In the embodiment above, the conductive layer 203 is formed between the lower surface of the second base substrate 201 and the black matrix 204 as well as the color filter layer 205, but embodiments of the present disclosure are not limited thereto.

Figure 7:
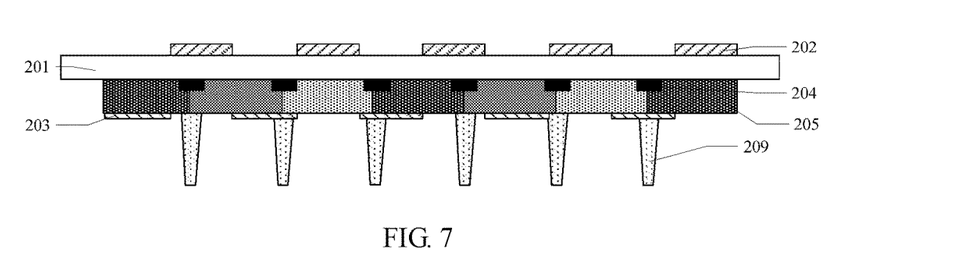
FIG. 7 is a schematic diagram showing a sectional structure of a counter substrate of a touch liquid crystal display panel provided by another embodiment of the present disclosure.

With reference to FIG. 7, in a counter substrate of a touch liquid crystal display panel provided by another embodiment of the present disclosure, the conductive layer 203 is formed between the color filter layer 205 and the post spacers 209 on the lower surface of the second base substrate 201. The counter substrate, for example, is formed via a method below: firstly, sequentially forming the black matrix 204 and the color filter layer (e.g., the R/G/B resin layer) on the lower surface of the second base substrate (e.g., the glass substrate); then, forming the conductive layer 203 on the lower surface of the color filter layer (e.g., the R/G/B resin layer), and forming the post spacers on the conductive layer 203; and next, after carrying out cell assembling of the second base substrate 201 on which the structures above are formed and the array substrate 10, forming the plurality of touch electrodes 202 on the upper surface of the second base substrate 201.

Figure 8:
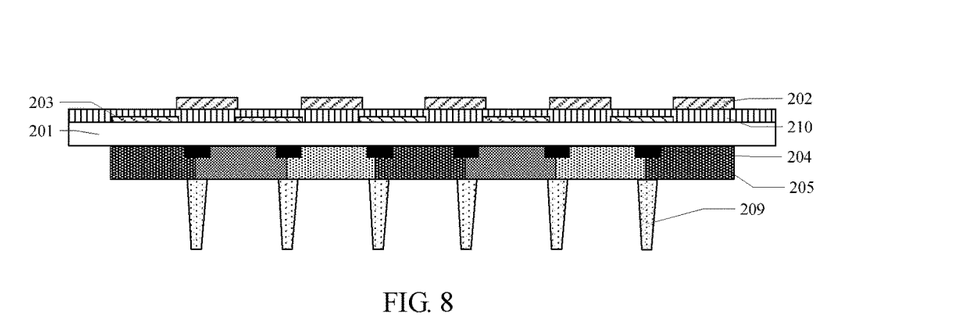
FIG. 8 is a schematic diagram showing a sectional structure of a counter substrate of a touch liquid crystal display panel provided by yet another embodiment of the present disclosure.

With reference to FIG. 8, in a counter substrate of a touch liquid crystal display panel provided by yet another embodiment of the present disclosure, the conductive layer 203 and the plurality of touch electrodes 202 are all formed on the upper surface of the second base substrate 201, and an insulating layer 210 is formed between the conductive layer 203 and the plurality of touch electrodes 202. The counter substrate, for example, is formed via a method below: firstly, sequentially forming the black matrix 204, the color filter layer (e.g., the R/G/B resin layer) and the post spacers 209 on the lower surface of the second base substrate (e.g., the glass substrate); and then, after carrying out cell assembling of the second base substrate 201 on which the structures above are formed and the array substrate 10, sequentially forming the conductive layer 203, the insulating layer 210 and the plurality of touch electrodes 202 on the upper surface of the second base substrate 201.

Figure 9:
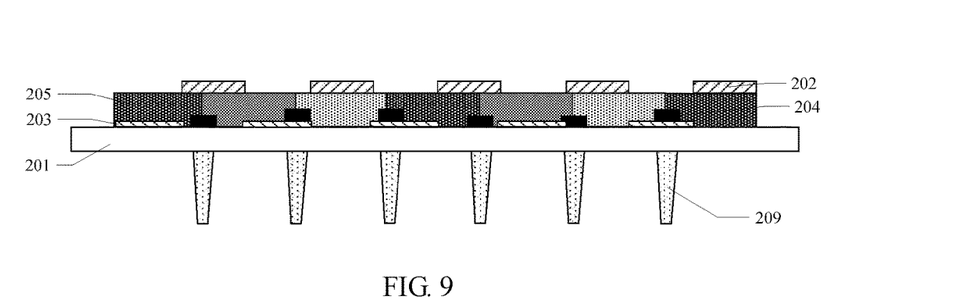
FIG. 9 is a schematic diagram showing a sectional structure of a counter substrate of a touch liquid crystal display panel provided by still a further embodiment of the present disclosure.

With reference to FIG. 9, in a counter substrate of a touch liquid crystal display panel provided by a further embodiment of the present disclosure, the conductive layer 203 is formed between the upper surface of the base substrate and the black matrix 204 as well as the color filter layer 205. The counter substrate, for example, is formed via a method below: firstly, forming the post spacers 209 on the lower surface of the second base substrate (e.g., the glass substrate); and then, after carrying out cell assembling of the second base substrate 201 on which the post spacers 209 is formed and the array substrate 10, sequentially forming the conductive layer 203, the black matrix 204, the color filter layer (e.g., the R/G/B resin layer) and the plurality of touch electrodes 202 on the upper surface of the second base substrate 201.

It is understood that in another embodiment, the post spacers 209 may also be formed on the base substrate 10.

Moreover, the counter substrate provided by the embodiments of the present disclosure not only can be used for the touch liquid crystal display panel, but also can be used for touch displays, such as an organic light-emitting display panel, electronic paper and the like.

It can be understood that the counter substrate 20 in the embodiments above is one of touch substrates. In the embodiments above of the present disclosure, the conductive layer 203 and the plurality of touch electrodes 202 are formed on at least one of the first base substrate 101 and the second base substrate 201, but the embodiments of the present disclosure are not limited thereto. In a touch substrate provided by another embodiment of the present disclosure, the conductive layer 203, the plurality of touch electrodes 202, the plurality of wirings and the like, for example, may be formed on a third base substrate, and the third base substrate is different from the first base substrate 101 and the second base substrate 201 of the liquid crystal display panel. A layout mode of the conductive layer 203, the plurality of touch electrodes 202, the plurality of wirings and the like on the third base substrate is substantially the same with that of the conductive layer 203, the plurality of touch electrodes 202, the plurality of wirings and the like on the second base substrate 201.

Although the disclosure has been described above in great detail with general descriptions and specific embodiments, on the basis of the embodiment of the disclosure, various changes or improvements may be made, which is apparent to those skilled in the art. Therefore, all such changes or improvements without departing from the spirit of the disclosure are within the scope of the claims of the disclosure The present application claims priority of the Chinese Patent Application No. 201610282657.0 filed on Apr. 29, 2016, the disclosure of which are incorporated herein by its reference in its entirety as part of the present application.

The invention claimed is:

1. A touch substrate, with an active display region, the touch substrate comprising:
   a base substrate;
   a plurality of touch electrodes formed on the base substrate and positioned in the active display region; and
   a conductive layer formed on the base substrate and positioned in the active display region, wherein the conductive layer is configured to generate heat in a state of being applied with a voltage,
   wherein the conductive layer is electrically insulated from any of the touch electrodes, and in a direction perpendicular to the base substrate, the conductive layer is not overlapped with any of the touch electrodes,
   wherein the active display region of the touch substrate includes a plurality of gap regions which are not overlapped with each other, the plurality of touch electrodes are not overlapped with any of the gap regions in the direction perpendicular to the base substrate, an edge of an orthogonal projection of each gap region on the upper surface of the base substrate is at least partially overlapped with an edge of the orthogonal projection of at least one of the plurality of touch electrodes on the upper surface of the base substrate, and the touch substrate further includes: at least one wiring formed on the base substrate and positioned in at least one of the gap regions, the at least one wiring and the plurality of touch electrodes being positioned in a same layer level and being formed by a same material,
   wherein the orthogonal projection of the conductive layer on the upper surface of the base substrate is not overlapped with an orthogonal projection of any one of the at least one wiring on the upper surface of the base substrate, and the orthogonal projection of the conductive layer on the upper surface of the base substrate and the orthogonal projections of the plurality of touch electrodes and the at least one wiring on the upper surface of the base substrate cover all the upper surface of the base substrate in the active display region.

2. The touch substrate according to claim 1, wherein an orthogonal projection of the conductive layer on an upper surface of the base substrate and orthogonal projections of the plurality of touch electrodes on the upper surface of the base substrate cover all the upper surface of the base substrate in the active display region.

3. The touch substrate according to claim 1, wherein the orthogonal projection of the conductive layer on the upper surface of the base substrate covers all the upper surface of the base substrate in the at least one of the gap regions in which the at least one wiring is formed.

4. The touch substrate according to claim 1, wherein the conductive layer and the plurality of touch electrodes are formed by a same transparent conductive material.

5. The touch substrate according to claim 1, wherein the conductive layer and the plurality of touch electrodes are arranged on two opposite sides of the base substrate; or, the conductive layer and the plurality of touch electrodes are arranged in different layer levels at a same side of the base substrate, and the conductive layer is insulated from the plurality of touch electrodes by an insulating layer arranged therebetween.

6. The touch substrate according to claim 1, wherein the conductive layer and the plurality of touch electrodes are formed by a same transparent conductive material.

7. The touch substrate according to claim 1, wherein the conductive layer and the plurality of touch electrodes are arranged on two opposite sides of the base substrate; or, the conductive layer and the plurality of touch electrodes are arranged in different layer levels at a same side of the base substrate, and the conductive layer is insulated from the plurality of touch electrodes by an insulating layer arranged therebetween.

8. The touch substrate according to claim 1, further comprising: a black matrix and a color filter layer, formed on the base substrate.

9. A touch liquid crystal display panel, comprising: an array substrate, a counter substrate, and a liquid crystal layer arranged between the array substrate and the counter substrate, wherein the array substrate includes a first base substrate and a plurality of pixel units formed on the first base substrate, and the counter substrate includes a second base substrate; and the touch liquid crystal display panel further comprising: a plurality of touch electrodes formed on at least one of the first base substrate and the second base substrate, and a conductive layer formed on at least one of the first base substrate and the second base substrate, wherein the conductive layer is configured to generate heat in a state of being applied with a voltage, the touch liquid crystal display panel has an active display region, the plurality of touch electrodes and the conductive layer are positioned in the active display region, the conductive layer is electrically insulated from any of the touch electrodes, and in a direction perpendicular to the second base substrate, the conductive layer is not overlapped with any of the touch electrodes,
   wherein the active display region of the touch liquid crystal display panel includes a plurality of gap regions which are not overlapped with each other, the plurality of touch electrodes are not overlapped with any of the gap regions in the direction perpendicular to the second base substrate, an edge of an orthogonal projection of each gap region on the upper surface of the second base substrate is at least partially overlapped with an edge of the orthogonal projection of at least one of the plurality of touch electrodes on the upper surface of the second base substrate, and the touch liquid crystal display panel further includes: at least one wiring formed on the second base substrate and positioned in at least one of the gap regions, the at least one wiring and the plurality of touch electrodes being positioned in a same layer level and being formed by a same material,
   wherein the orthogonal projection of the conductive layer on the upper surface of the second base substrate is not overlapped with an orthogonal projection of any of the at least one wiring on the upper surface of the second base substrate, and the orthogonal projection of the conductive layer on the upper surface of the second base substrate and the orthogonal projections of the plurality of touch electrodes and the at least one wiring on the upper surface of the second base substrate cover all the upper surface of the second base substrate in the active display region.

10. The touch liquid crystal display panel according to claim 9, wherein an orthogonal projection of the conductive layer on an upper surface of the second base substrate and orthogonal projections of the plurality of touch electrodes on the upper surface of the second base substrate cover all the upper surface of the second base substrate in the active display region.

11. The touch liquid crystal display panel according to claim 9, wherein the orthogonal projection of the conductive layer on the upper surface of the second base substrate covers all the upper surface of the second base substrate in the at least one of the gap regions in which the at least one wiring is formed.

12. The touch liquid crystal display panel according to claim 9, wherein the conductive layer and the plurality of touch electrodes are formed by a same transparent conductive material.

13. The touch liquid crystal display panel according to claim 9, wherein the conductive layer and the plurality of touch electrodes are arranged on two opposite sides of the second base substrate; or, the conductive layer and the plurality of touch electrodes are arranged in different layer levels at a same side of the second base substrate, and the conductive layer is insulated from the plurality of touch electrodes by an insulating layer arranged therebetween.

14. The touch liquid crystal display panel according to claim 9, further comprising a temperature sensor arranged on the second base substrate.

15. The touch liquid crystal display panel according to claim 9, wherein the conductive layer and the plurality of touch electrodes are formed by a same transparent conductive material.

16. A touch substrate, with an active display region, the touch substrate comprising:

a base substrate;

a plurality of touch electrodes formed on the base substrate and positioned in the active display region;

at least one wiring formed on the base substrate; and a conductive layer formed on the base substrate and positioned in the active display region, wherein the conductive layer is configured to generate heat in a state of being applied with a voltage, wherein the conductive layer is electrically insulated from any of the touch electrodes, and in a direction perpendicular to the base substrate, the conductive layer is not overlapped with any of the touch electrodes, wherein the orthogonal projection of the conductive layer on the upper surface of the base substrate is not overlapped with an orthogonal projection of any one of the at least one wiring on the upper surface of the base substrate, and the orthogonal projection of the conductive layer on the upper surface of the base substrate and the orthogonal projections of the plurality of touch electrodes and the at least one wiring on the upper surface of the base substrate cover all the upper surface of the base substrate in the active display region.

* * * * *